United States Patent
Iwamoto et al.

(10) Patent No.: US 12,545,487 B2
(45) Date of Patent: Feb. 10, 2026

(54) ELECTRONIC COMPONENT CARRIER TAPE, ELECTRONIC COMPONENT PACKAGING TAPE, AND ELECTRONIC COMPONENT PACKAGE

(71) Applicant: Murata Manufacturing Co., Ltd., Nagaokakyo (JP)

(72) Inventors: Koichi Iwamoto, Nagaokakyo (JP); Yasuhiro Shimizu, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 18/657,887

(22) Filed: May 8, 2024

(65) Prior Publication Data

US 2024/0292588 A1    Aug. 29, 2024

Related U.S. Application Data

(63) Continuation of application No. PCT/JP2023/016731, filed on Apr. 27, 2023.

(30) Foreign Application Priority Data

Jun. 6, 2022  (JP) ................. 2022-091557

(51) Int. Cl.
  *B65D 73/02*    (2006.01)
  *H05K 13/00*    (2006.01)
(52) U.S. Cl.
  CPC ......... *B65D 73/02* (2013.01); *H05K 13/0084* (2013.01)

(58) Field of Classification Search
  CPC .. B65D 73/02; H05K 13/0084; H05K 13/021; H05K 13/0419; B65B 15/04; B65H 19/28; B65H 2301/41427; B65H 2301/41429
  USPC ................. 206/713, 714; 242/532.1, 532.3
  See application file for complete search history.

(56) References Cited

U.S. PATENT DOCUMENTS

| 4,747,553 A * | 5/1988 | Ogawa ................. H05K 13/021 |
| | | 242/532.6 |
| 5,601,243 A * | 2/1997 | Inagaki .................. B65H 19/28 |
| | | 242/582 |
| 6,123,286 A * | 9/2000 | Garcia et al. ...... H05K 13/0421 |
| | | 242/532.6 |

(Continued)

FOREIGN PATENT DOCUMENTS

| JP | H06171666 A | 6/1994 |
| JP | H074223 Y2 * | 2/1995 |

(Continued)

OTHER PUBLICATIONS

International Search Report in PCT/JP2023/016731, mailed Jun. 6, 2023, 3 pages.

(Continued)

*Primary Examiner* — Stephen F. Gerrity
(74) *Attorney, Agent, or Firm* — Keating & Bennett, LLP

(57) ABSTRACT

An electronic component carrier tape has an elongated shape, and includes a plurality of recessed pockets at equal or substantially equal intervals in a longitudinal direction and each accommodating a respective one of the plurality of electronic components. The electronic component carrier tape includes a flat plate-shaped core at one end portion in the longitudinal direction.

19 Claims, 10 Drawing Sheets

(56) References Cited

U.S. PATENT DOCUMENTS

| | | | |
|---|---|---|---|
| 6,478,247 B2* | 11/2002 | Fujiwara et al. | B65H 19/28 |
| | | | 242/532.3 |
| 2021/0101730 A1* | 4/2021 | Shimizu | B65B 15/04 |
| 2023/0156993 A1* | 5/2023 | Isobata et al. | H05K 13/0419 |
| | | | 206/714 |

FOREIGN PATENT DOCUMENTS

| JP | H11152179 A | | 6/1999 |
|---|---|---|---|
| JP | 2929184 B2 | * | 8/1999 |
| JP | 2000177894 A | | 6/2000 |
| JP | 2007106537 A | * | 4/2007 |
| JP | 2015117025 A | | 6/2015 |

OTHER PUBLICATIONS

Written Opinion in PCT/JP2023/016731, mailed Jun. 6, 2023, 3 pages.

* cited by examiner

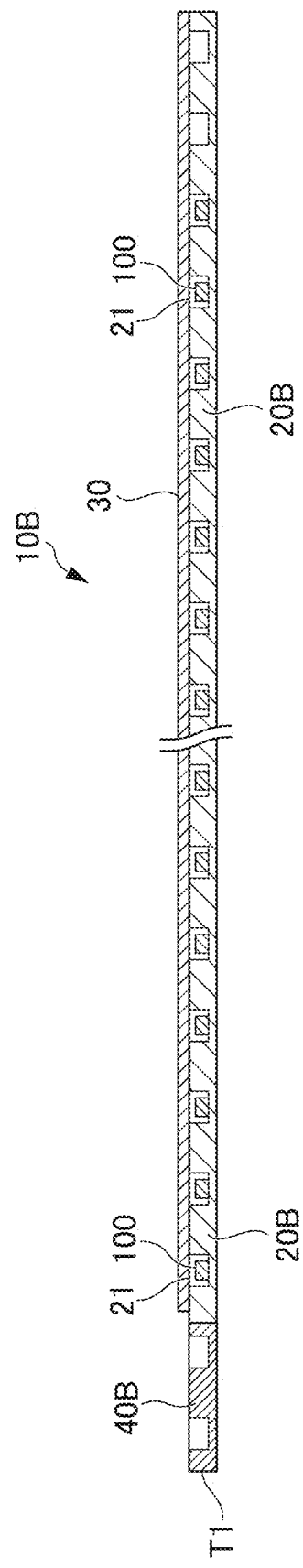

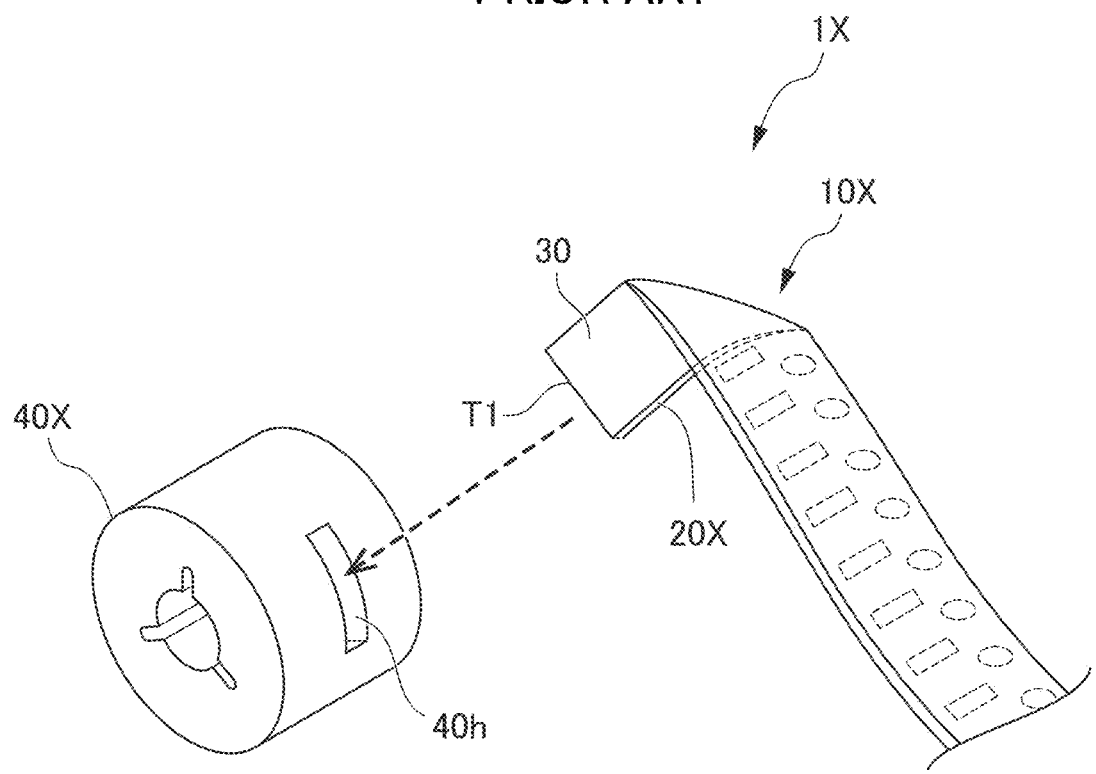

ELECTRONIC COMPONENT CARRIER TAPE, ELECTRONIC COMPONENT PACKAGING TAPE, AND ELECTRONIC COMPONENT PACKAGE

CROSS REFERENCE TO RELATED APPLICATIONS

This application claims the benefit of priority to Japanese Patent Application No. 2022-091557 filed on Jun. 6, 2022 and is a Continuation Application of PCT Application No. PCT/JP2023/016731 filed on Apr. 27, 2023. The entire contents of each application are hereby incorporated herein by reference.

BACKGROUND OF THE INVENTION

1. Field of the Invention

The present invention relates to electronic component carrier tapes, electronic component packaging tapes, and electronic component packages.

2. Description of the Related Art

As an electronic component packaging configuration, an electronic component package (a taping reel) has been known which has an elongated or strip-shaped electronic component packaging tape adapted for a mounter for automatic mounting wound therearound (for example, see Japanese Unexamined Patent Application Publication No. H6-171666). Such an electronic component package is configured such that the electronic component packaging tape is wound around a cylindrical core. The electronic component packaging tape includes an electronic component carrier tape including a plurality of recessed pockets arranged at equal intervals in a longitudinal direction, and a cover tape attached to the electronic component carrier tape to cover openings of the plurality of recessed pockets. Each of the plurality of recessed pockets accommodates (houses, contains) an electronic component.

In such an electronic component package, the cylindrical core is fitted to the mounter, and the electronic component packaging tape (the electronic component carrier tape) is gradually pulled out while the electronic component package rotates when the electronic components are automatically mounted by the mounter. When the electronic component packaging tape (electronic component carrier tape) is completely pulled out, the core remains on the mounter. Therefore, an operation of removing the core is performed, which deteriorates the workability of automatic mounting of the electronic components.

SUMMARY OF THE INVENTION

Example embodiments of the present invention provide electronic component carrier tapes, electronic component packaging tapes, and electronic component packages that each improve workability of automatic mounting of electronic components.

An electronic component carrier tape according to an example embodiment of the present invention accommodates a plurality of electronic components. The carrier tape has an elongated shape. The electronic component carrier tape includes a plurality of recessed pockets located at equal or substantially equal intervals in a longitudinal direction and each accommodating a respective one of the plurality of electronic components, and a flat plate-shaped core provided at one end portion in the longitudinal direction.

An electronic component packaging tape according to an example embodiment of the present invention includes an electronic component carrier tape according to an example embodiment of the present invention, a cover tape having an elongated shape and attached to the electronic component carrier tape to cover an opening of each of a plurality of pockets, and a plurality of electronic components each accommodated in a respective one of the plurality of pockets.

An electronic component package according to an example embodiment of the present invention includes an electronic component packaging tape according to an example embodiment of the present invention. The electronic component packaging tape is wound around the electronic component package with a flat plate-shaped core as a winding start.

According to example embodiments of the present invention, it is possible to improve the workability of automatic mounting of electronic components.

The above and other elements, features, steps, characteristics and advantages of the present invention will become more apparent from the following detailed description of the example embodiments with reference to the attached drawings.

BRIEF DESCRIPTION OF THE DRAWINGS

FIG. 9 is a cross-sectional view taken along the line IX-IX of the electronic component packaging tape and the electronic component carrier tape shown in FIG. 8.

FIG. 10 is a perspective view showing a fitting portion between a cylindrical core and an electronic component packaging tape (an electronic component carrier tape) in a conventional electronic component package.

DETAILED DESCRIPTION OF THE EXAMPLE EMBODIMENTS

Hereinafter, example embodiments of the present invention will be described in detail with reference to the accom-

First Example Embodiment

Electronic Component Package

Figure 1:
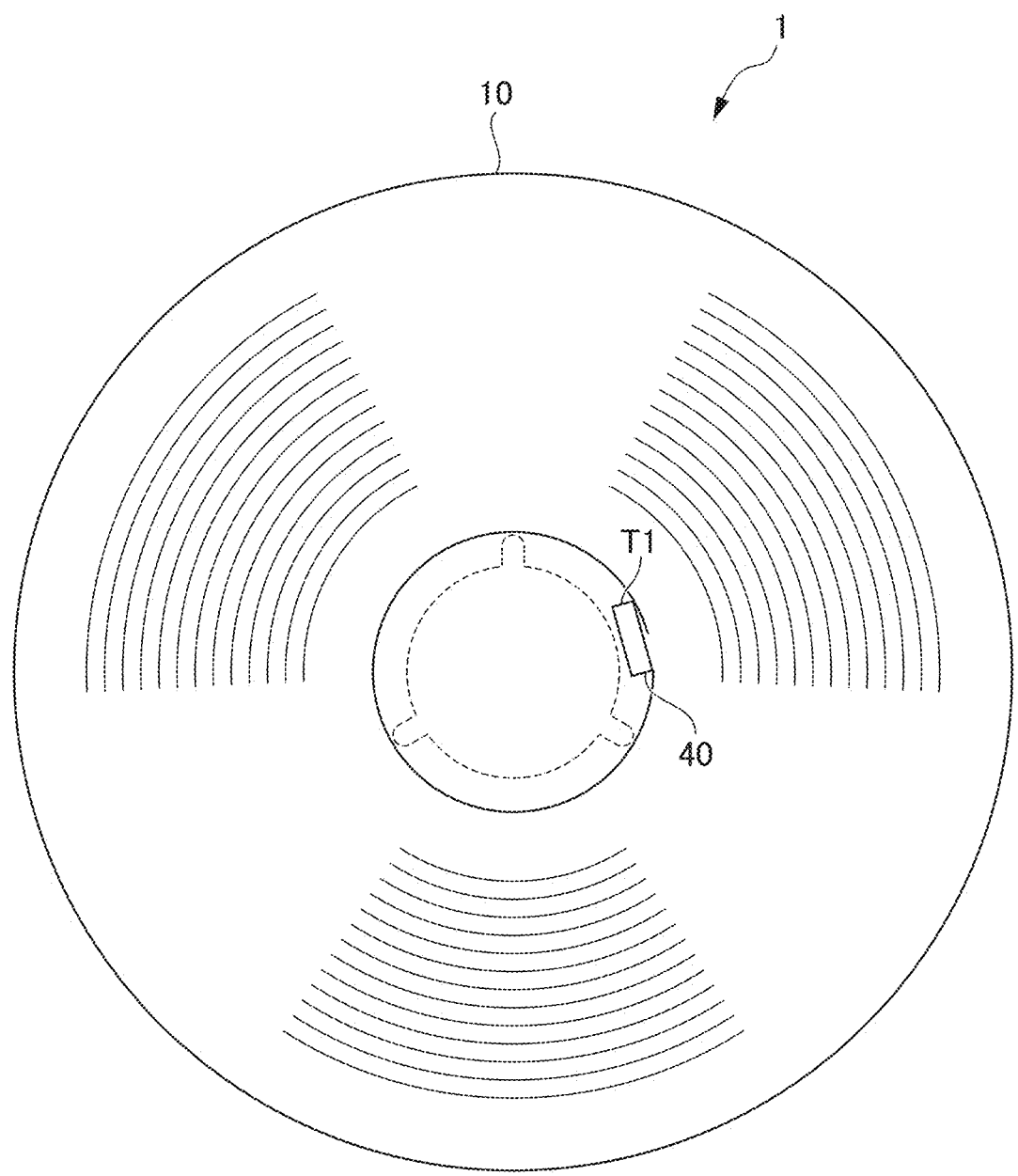
FIG. 1 is a side view showing an electronic component package according to a first example embodiment of the present invention.

FIG. 1 is a side view showing an electronic component package according to a first example embodiment of the present invention. As shown in FIG. 1, the electronic component package 1 is configured such that an electronic component packaging tape 10 is wound therearound with one end portion T1, that is, a core 40, as a winding start. For example, the electronic component packaging tape 10 is wound therearound such that a cover tape side described later is located at the inner peripheral side. The electronic component package 1 is also referred to as a taping reel.

Electronic Component Packaging Tape and Electronic Component Carrier Tape

Figure 2:
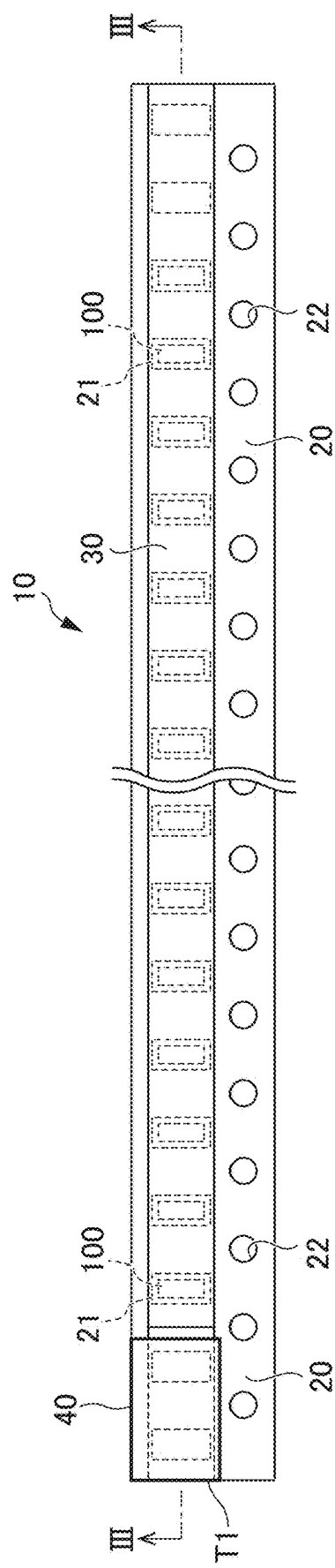
FIG. 2 is a plan view showing an electronic component packaging tape and an electronic component carrier tape according to the first example embodiment of the present invention.
Figure 3:
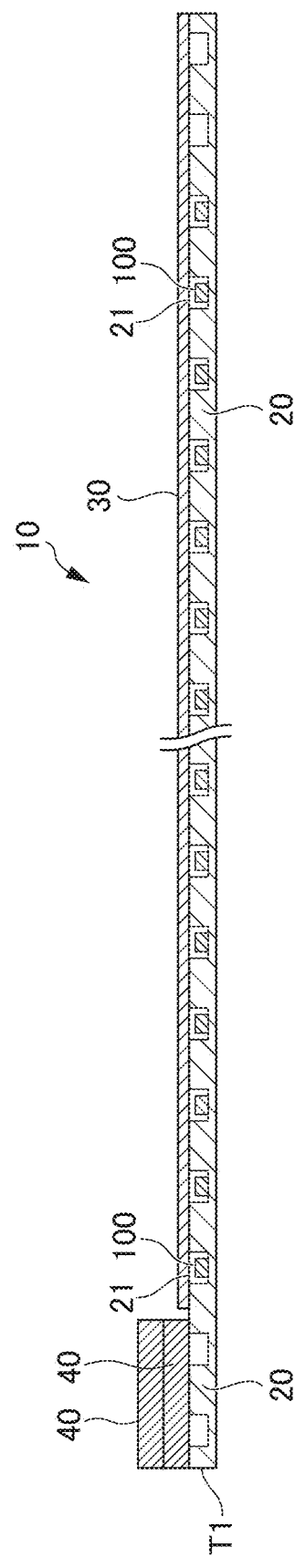
FIG. 3 is a cross-sectional view taken along the line III-III of the electronic component packaging tape and the electronic component carrier tape shown in FIG. 2.

FIG. 2 is a plan view showing the electronic component packaging tape and the electronic component carrier tape according to the first example embodiment, and FIG. 3 is a cross-sectional view taken along the line III-III of the electronic component packaging tape and the electronic component carrier tape shown in FIG. 2. As shown in FIGS. 2 and 3, the electronic component packaging tape 10 includes an electronic component carrier tape 20, a cover tape 30, and a plurality of electronic components 100.

The electronic component carrier tape 20 is an elongated or strip-shaped member. The electronic component carrier tape 20 includes a plurality of pockets 21 arranged at equal or substantially equal intervals in the longitudinal direction. Each of the plurality of pockets 21 is a recessed depression to accommodate (e.g., house or contain) the electronic component 100, and includes an opening to remove the electronic component. Further, the electronic component carrier tape 20 includes a plurality of feed holes 22 arranged at equal or substantially equal intervals in the longitudinal direction. The plurality of feed holes 22 are used to convey when electronic components are automatically mounted by a mounter. The material of the electronic component carrier tape 20 is not particularly limited, and, for example, resin, paper, or the like can be used. In addition, the electronic component carrier tape 20 and the electronic component packaging tape 10 are sometimes referred to as an electronic component series because the electronic components are arranged in a row.

The cover tape 30 is an elongated or strip-shaped member. The cover tape 30 is attached to the electronic component carrier tape 20 so as to cover the openings of the plurality of pockets 21 and not block the feed holes 22. Thus, each of the electronic components 100 is sealed in each of the plurality of pockets 21. The cover tape 30 is releasably or peelably attached to the electronic component carrier tape 20. The material of the cover tape 30 is not particularly limited, and, for example, resin, paper, or the like can be used.

The plurality of electronic components 100 are respectively accommodated (housed, contained) in the plurality of pockets 21 of the electronic component carrier tape 20. Examples of the electronic component 100 include various surface mount type electronic components such as a multilayer ceramic capacitor with a dielectric ceramic, a piezoelectric component with a piezoelectric ceramic, a thermistor with a semiconductor ceramic, and an inductor with a magnetic ceramic.

Core

A flat plate-shaped core 40 is provided at one end portion T1 in the longitudinal direction of the electronic component carrier tape 20, that is, at one end portion T1 in the longitudinal direction of the electronic component packaging tape 10. The core 40 is made of the same material as the electronic component carrier tape 20, and is provided in a protruding shape on the main surface of the electronic component carrier tape 20, which is located on the cover tape 30 side. For example, the core 40 may be configured such that one or a plurality of cut ends of the electronic component carrier tape 20 are bonded in a superimposed manner on the main surface of the one end portion T1 of the electronic component carrier tape 20. Alternatively, the core 40 may be configured such that the one end portion of the electronic component carrier tape 20 is folded back one or a plurality of times, and bonded. In addition, the core 40 may be provided in a protruding shape on the main surface of the electronic component carrier tape 20 opposite to the cover tape 30.

Here, FIG. 10 is a perspective view showing a fitting portion between a cylindrical core and an electronic component packaging tape (an electronic component carrier tape) in a conventional electronic component package. As shown in FIG. 10, in a conventional electronic component package 1X, one end portion T1 of an electronic component packaging tape 10X (an electronic component carrier tape 20X) is simply inserted into a hole 40h of a cylindrical core 40X, and the electronic component packaging tape 10X (the electronic component carrier tape) 20X is wound around the cylindrical core 40X.

In such an electronic component package 1X, the cylindrical core 40X is fitted to the mounter, and the electronic component packaging tape 10X (the electronic component carrier tape 20X) is gradually pulled out, while the electronic component package 1X rotates when electronic components are automatically mounted by the mounter. When the electronic component packaging tape 10X (the electronic component carrier tape 20X) is completely pulled out, the core 40X remains in the mounter. Therefore, an operation of removing the core 40X is performed, and the workability of automatic mounting of the electronic components is deteriorated.

In this regard, according to the electronic component carrier tape 20, the electronic component packaging tape 10, and the electronic component package 1 of the first example embodiment, the shape of the core 40 is not a cylindrical shape, and instead is a flat plate shape, and is provided and fixed at the one end portion T1 of the electronic component carrier tape 20, that is, the electronic component packaging tape 10. With such a configuration, when the electronic components are automatically mounted by the mounter, the core 40 is pulled out together with the electronic component packaging tape 10 (the electronic component carrier tape 20), and does not remain on the mounter. Therefore, unlike the related art, the operation of removing the cylindrical core is not required, and it is possible to improve the workability of automatic mounting of the electronic components.

In addition, with such a flat plate-shaped core 40, it is possible to stabilize the one end portion T1, which defines and functions as a winding start, when the electronic component packaging tape 10 (the electronic component carrier tape 20) is wound.

When the electronic component package 1 is fitted to the mounter, the flat plate-shaped core 40 defines and functions as a fitting portion. For example, as shown in FIG. 1, the fitting portion of the mounter includes three protruding portions with a cylindrical shape (a broken line portion). The flat plate-shaped core 40 can be suitably fitted to the fitting portion of such a mounter. Further, since the core 40 has a protruding shape, it can be suitably fitted to the fitting portion of such a mounter.

Second Example Embodiment

Electronic Component Package

Figure 4:
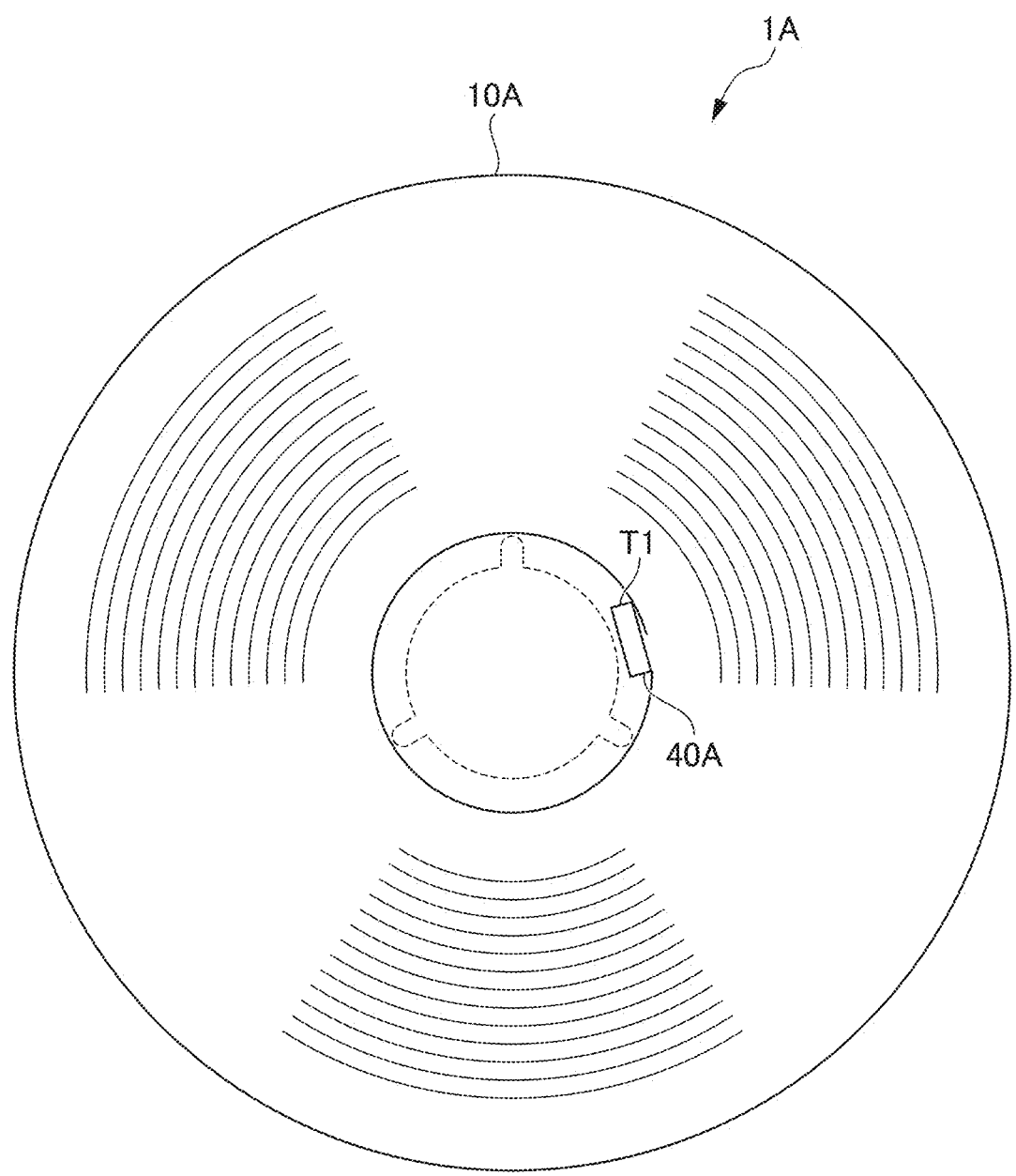
FIG. 4 is a side view showing an electronic component package according to a second example embodiment of the present invention.

FIG. 4 is a side view showing an electronic component package according to a second example embodiment of the present invention. As shown in FIG. 4, an electronic component package 1A according to the second example embodiment includes an electronic component packaging tape 10A instead of the electronic component packaging tape 10 in the electronic component package 1 of the first example embodiment shown in FIG. 1. The electronic component package 1A is configured such that an electronic component packaging tape 10A is wound therearound with one end portion T1, that is, a core 40A as a winding start.

Electronic Component Packaging Tape and Electronic Component Carrier Tape

Figure 5:
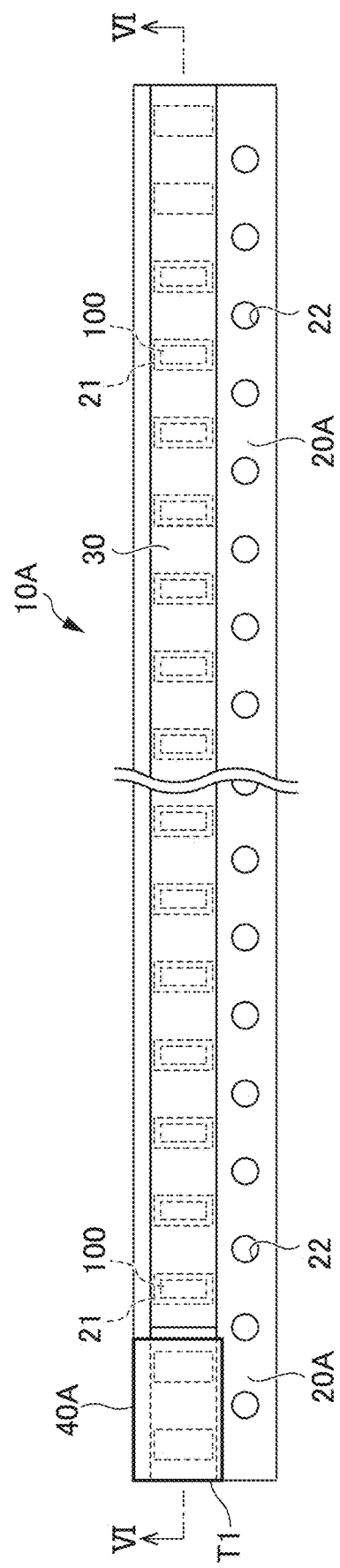
FIG. 5 is a plan view showing an electronic component packaging tape and an electronic component carrier tape according to the second example embodiment of the present invention.
Figure 6:
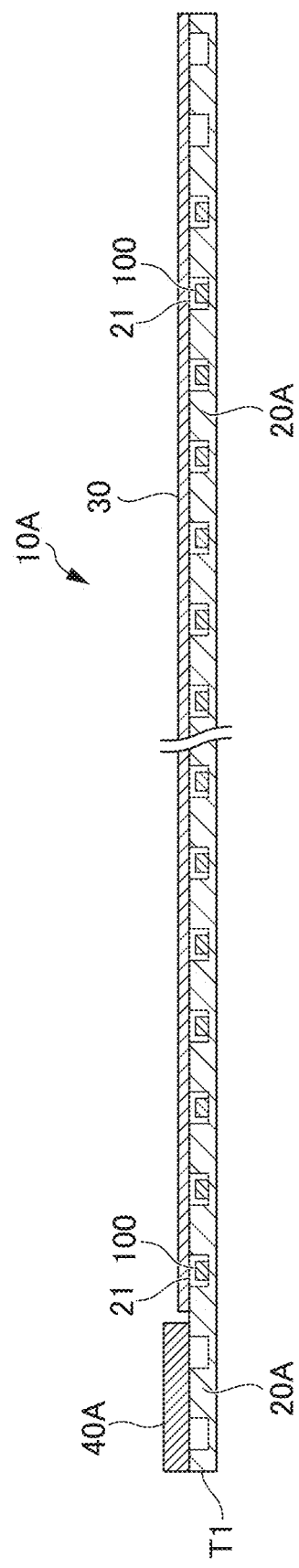
FIG. 6 is a cross-sectional view taken along the line VI-VI of the electronic component packaging tape and the electronic component carrier tape shown in FIG. 5.

FIG. 5 is a plan view showing an electronic component packaging tape and an electronic component carrier tape according to the second example embodiment, and FIG. 6 is a cross-sectional view taken along the line VI-VI of the electronic component packaging tape and the electronic component carrier tape shown in FIG. 5. As shown in FIGS. 5 and 6, the electronic component packaging tape 10A of the second example embodiment includes an electronic component carrier tape 20A instead of the electronic component carrier tape 20 in the electronic component packaging tape 10 of the first example embodiment shown in FIGS. 2 and 3. The other configurations of the electronic component packaging tape 10A are the same as those of the electronic component packaging tape 10 of the first example embodiment.

Core

The electronic component carrier tape 20A includes a core 40A instead of the core 40 in the electronic component carrier tape 20 of the first example embodiment. The other configurations of the electronic component carrier tape 20A are the same or substantially the same as those of the electronic component carrier tape 20 of the first example embodiment.

The flat plate-shaped core 40A is provided at one end portion T1 in the longitudinal direction of the electronic component carrier tape 20A, that is, at one end portion T1 in the longitudinal direction of the electronic component packaging tape 10A. The core 40A is made of an adhesive material, and is provided in a protruding shape on the main surface of the electronic component carrier tape 20A which is located on the cover tape 30 side. Examples of the adhesive material include an adhesive tape. For example, the core 40A may be configured such that an adhesive tape is bonded in a superimposed manner on the main surface of the one end portion T1 of the electronic component carrier tape 20A. In addition, the core 40A may be provided in a protruding shape on the main surface of the electronic component carrier tape 20A opposite to the cover tape 30.

Also in the electronic component carrier tape 20A, the electronic component packaging tape 10A, and the electronic component package 1A of the second example embodiment, the shape of the core 40A is not a cylindrical shape, but rather a flat plate shape, and is provided and fixed at the one end portion T1 of the electronic component carrier tape 20A, that is, the electronic component packaging tape 10A. With such a configuration, when the electronic components are automatically mounted by the mounter, the core 40A is pulled out together with the electronic component packaging tape 10A (the electronic component carrier tape 20A), and does not remain on the mounter. Therefore, unlike the related art, the operation of removing the cylindrical core does not occur, and it is possible to improve the workability of automatic mounting of the electronic components.

In addition, with such a flat plate-shaped core 40A, it is possible to stabilize the one end portion T1, which defines and functions as a winding start, when the electronic component packaging tape 10A (the electronic component carrier tape 20A) is wound.

When the electronic component package 1A is fitted to the mounter, the flat plate-shaped core 40A defines and functions as a fitting portion. For example, as shown in FIG. 4, the fitting portion of the mounter includes three protruding portions in a cylindrical shape (a broken line portion). The flat plate-shaped core 40A can be suitably fitted to the fitting portion of such a mounter. Further, since the core 40A has a protruding shape, it can be suitably fitted to the fitting portion of such a mounter. Further, since the core 40A is made of an adhesive material, it can be suitably bonded to the fitting portion of such a mounter.

Third Example Embodiment

Electronic Component Package

Figure 7:
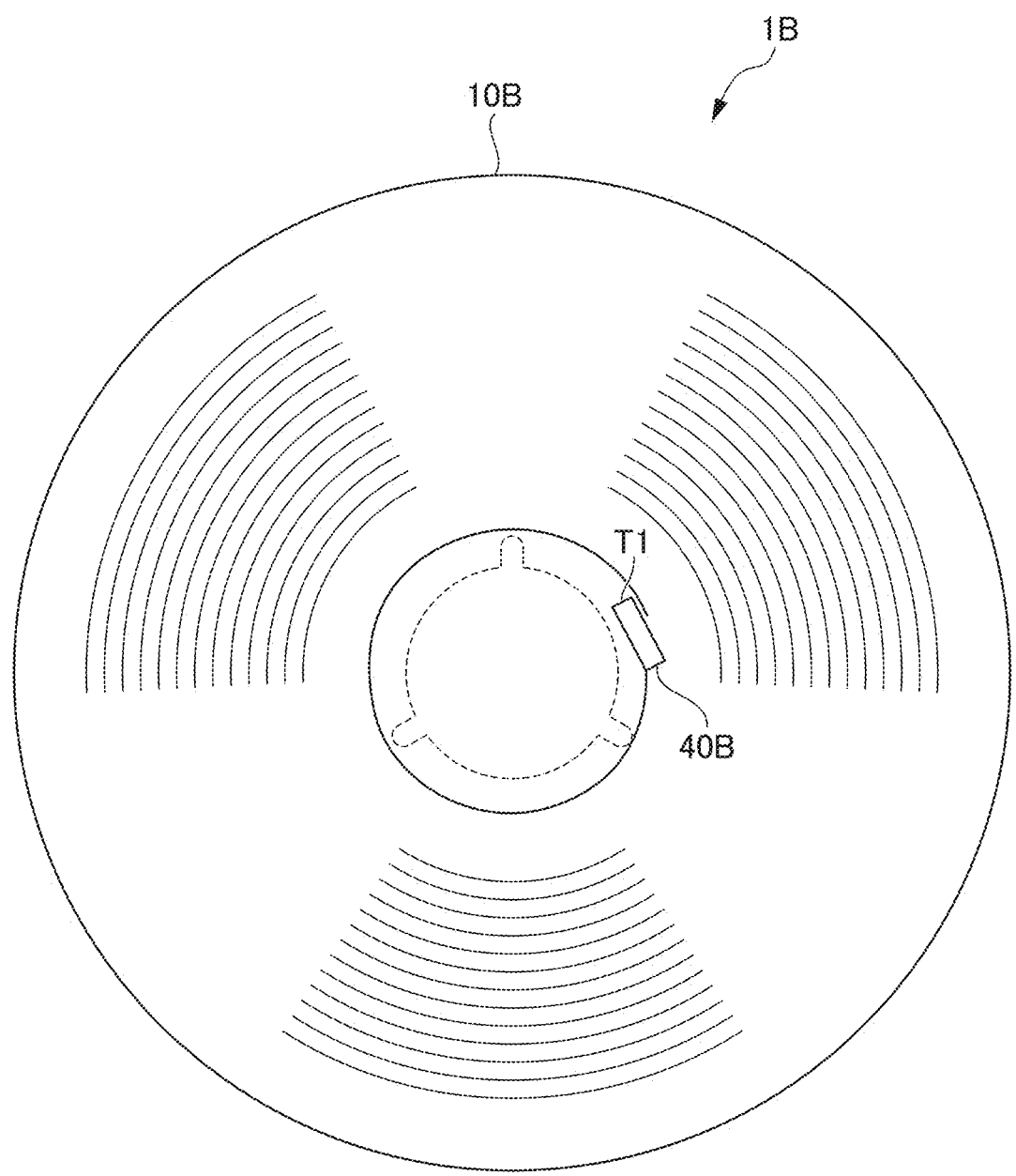
FIG. 7 is a side view showing an electronic component package according to a third example embodiment of the present invention.

FIG. 7 is a side view showing an electronic component package according to a third example embodiment of the present invention. As shown in FIG. 7, an electronic component package 1B of the third example embodiment includes an electronic component packaging tape 10B instead of the electronic component packaging tape 10 in the electronic component package 1 of the first example embodiment shown in FIG. 1. The electronic component package 1B is configured such that an electronic component packaging tape 10B is wound therearound with one end portion T1, that is, a core 40B as a winding start.

Electronic Component Packaging Tape and Electronic Component Carrier Tape

Figure 8:
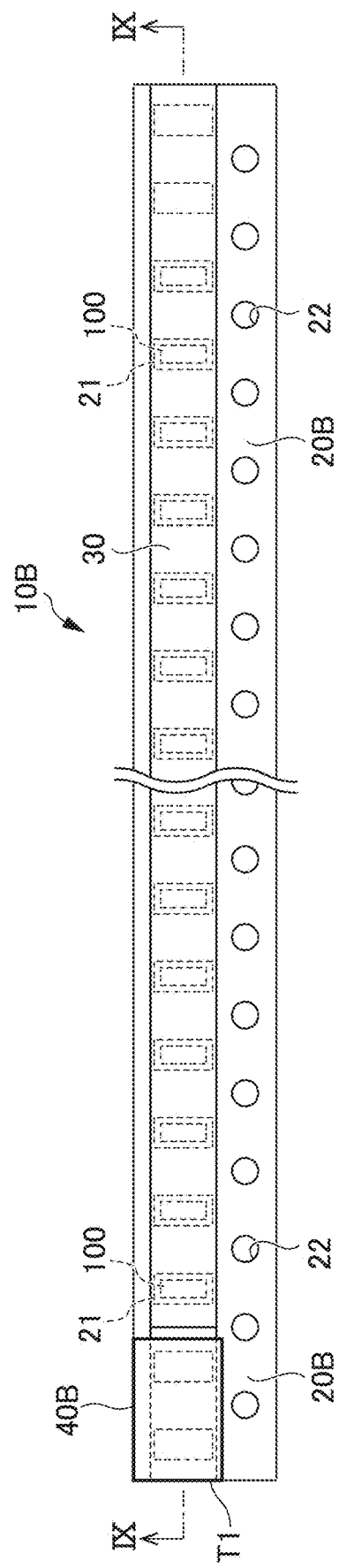
FIG. 8 is a plan view showing an electronic component packaging tape and an electronic component carrier tape according to the third example embodiment of the present invention.

FIG. 8 is a plan view showing an electronic component packaging tape and an electronic component carrier tape according to the third example embodiment, and FIG. 9 is a cross-sectional view taken along the line IX-IX of the electronic component packaging tape and the electronic component carrier tape shown in FIG. 8. As shown in FIGS. 8 and 9, the electronic component packaging tape 10B of the third example embodiment includes an electronic component carrier tape 20B instead of the electronic component carrier tape 20 in the electronic component packaging tape 10 of the first example embodiment shown in FIGS. 2 and 3. The other configurations of the electronic component packaging tape 10B are the same or substantially the same as those of the electronic component packaging tape 10 of the first example embodiment.

Core

The electronic component carrier tape 20B includes a core 40B instead of the core 40 in the electronic component carrier tape 20 of the first example embodiment. The other configurations of the electronic component carrier tape 20B are the same or substantially the same as those of the electronic component carrier tape 20 of the first example embodiment.

The flat plate-shaped core 40B is provided at one end portion T1 in the longitudinal direction of the electronic component carrier tape 20B, that is, at one end portion T1 in the longitudinal direction of the electronic component packaging tape 10B. The core 40B includes a curing agent.

Examples of the curing agent include a thermosetting resin such as an epoxy resin and a photocurable resin. For example, the core 40B may be configured such that the one end portion T1 of the electronic component carrier tape 20B is impregnated with the curing agent.

Also in the electronic component carrier tape 20B, the electronic component packaging tape 10B, and the electronic component package 1B of the third example embodiment, the shape of the core 40B is not a cylindrical shape, but rather a flat plate shape, and is provided and fixed at the one end portion T1 of the electronic component carrier tape 20B, that is, the electronic component packaging tape 10B. With such a configuration, when the electronic components are automatically mounted by the mounter, the core 40B is pulled out together with the electronic component packaging tape 10B (the electronic component carrier tape 20B), and does not remain on the mounter. Therefore, unlike the related art, the operation of removing the cylindrical core does not occur, and it is possible to improve the workability of automatic mounting of the electronic components.

In addition, with such a flat plate-shaped core 40B, it is possible to stabilize the one end portion T1, which defines and functions as a winding start, when the electronic component packaging tape 10B (the electronic component carrier tape 20B) is wound.

When the electronic component package 1B is fitted to the mounter, the flat plate-shaped core 40B defines and functions as a fitting portion. For example, as shown in FIG. 7, the fitting portion of the mounter includes three protruding portions in a cylindrical shape (a broken line portion). The flat plate-shaped core 40B can be suitably fitted to the fitting portion of such a mounter.

Although example embodiments of the present invention have been described above, the present invention is not limited to the above-described example embodiments, and various modifications and variations are possible. For example, the above-described example embodiments may be combined. For example, the cores 40, 40A, and 40B may include two or more of the same materials as the electronic component carrier tape, an adhesive, and a curing agent.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component carrier tape for accommodating a plurality of electronic components and having an elongated shape, the electronic component carrier tape comprising:
   a plurality of recessed pockets provided at equal or substantially equal intervals in a longitudinal direction and each accommodating a respective one of the plurality of electronic components; and
   a flat plate-shaped core at one end portion in the longitudinal direction; wherein the flat plate-shaped core includes a protruding portion on the main surface of the electronic component carrier tape; and wherein the flat plate-shaped core is made of a same material as that of the electronic component carrier tape and is bonded on a main surface of the electronic component carrier tape.

2. The electronic component carrier tape according to claim 1, further comprising feed holes arranged at equal or substantially equal intervals in the longitudinal direction.

3. The electronic component carrier tape according to claim 1, wherein the electronic component carrier tape includes resin or paper.

4. An electronic component packaging tape comprising:
   an electronic component carrier tape according to claim 1;
   a cover tape having an elongated shape and attached to the electronic component carrier tape to cover an opening of each of a plurality of pockets; and
   a plurality of electronic components each accommodated in a respective one of the plurality of pockets.

5. An electronic component package comprising:
   an electronic component packaging tape according to claim 4;
   wherein the electronic component packaging tape is wound around the electronic component package with the flat plate-shaped core as a winding start.

6. The electronic component package according to claim 5, wherein the electronic component carrier tape includes feed holes arranged at equal or substantially equal intervals in the longitudinal direction.

7. The electronic component package according to claim 5, wherein the electronic component carrier tape includes resin or paper.

8. An electronic component carrier tape for accommodating a plurality of electronic components and having an elongated shape, the electronic component carrier tape comprising:
   a plurality of recessed pockets provided at equal or substantially equal intervals in a longitudinal direction and each accommodating a respective one of the plurality of electronic components; and
   a flat plate-shaped core at one end portion in the longitudinal direction;
   where in the flat plate-shaped core includes a protruding portion on the main surface of the electronic component carrier tape; and wherein the flat plate-shaped core is made of an adhesive material and is bonded on a main surface of the electronic component carrier tape.

9. The electronic component carrier tape according to claim 8, further comprising feed holes arranged at equal or substantially equal intervals in the longitudinal direction.

10. The electronic component carrier tape according to claim 8, wherein the electronic component carrier tape includes resin or paper.

11. An electronic component packaging tape comprising:
    an electronic component carrier tape according to claim 8;
    a cover tape having an elongated shape and attached to the electronic component carrier tape to cover an opening of each of a plurality of pockets; and
    a plurality of electronic components each accommodated in a respective one of the plurality of pockets.

12. An electronic component package comprising:
    an electronic component packaging tape according to claim 11;
    wherein the electronic component packaging tape is wound around the electronic component package with the flat plate-shaped core as a winding start.

13. The electronic component package according to claim 12, wherein the electronic component carrier tape includes feed holes arranged at equal or substantially equal intervals in the longitudinal direction.

14. The electronic component package according to claim 12, wherein the electronic component carrier tape includes resin or paper.

15. An electronic component carrier tape for accommodating a plurality of electronic components and having an elongated shape, the electronic component carrier tape comprising:
- a plurality of recessed pockets provided at equal or substantially equal intervals in a longitudinal direction and each accommodating a respective one of the plurality of electronic components; and
- a flat plate-shaped core at one end portion in the longitudinal direction; wherein the flat plate-shaped core includes a protruding portion on the main surface of the electronic component carrier tape; and wherein the flat plate-shaped core includes a curing agent, and the one end portion of the electronic component carrier tape is impregnated with the curing agent.

16. The electronic component carrier tape according to claim 15, further comprising feed holes arranged at equal or substantially equal intervals in the longitudinal direction.

17. The electronic component carrier tape according to claim 15, wherein the electronic component carrier tape includes resin or paper.

18. An electronic component packaging tape comprising:
- an electronic component carrier tape according to claim 15;
- a cover tape having an elongated shape and attached to the electronic component carrier tape to cover an opening of each of a plurality of pockets; and
- a plurality of electronic components each accommodated in a respective one of the plurality of pockets.

19. An electronic component package comprising:
- an electronic component packaging tape according to claim 18;
- wherein the electronic component packaging tape is wound around the electronic component package with the flat plate-shaped core as a winding start.

* * * * *